United States Patent [19]

Hall

[11] 3,971,428
[45] July 27, 1976

[54] METHOD FOR MAKING BEAM LEADS

[75] Inventor: Ronald D. Hall, Baltimore, Md.

[73] Assignee: The United States of America as represented by the Secretary of the Navy, Washington, D.C.

[22] Filed: Oct. 17, 1975

[21] Appl. No.: 623,526

[52] U.S. Cl. .................................. 164/46; 29/630 R
[51] Int. Cl.² ...................... B22D 23/00; H05K 3/14
[58] Field of Search.......... 29/624, 625, 628, 630 R, 29/630 A; 164/46

[56] References Cited
UNITED STATES PATENTS

| | | | |
|---|---|---|---|
| 3,537,175 | 11/1970 | St. Clair et al. | 29/624 |
| 3,559,285 | 2/1971 | Kauffman | 29/626 X |
| 3,750,277 | 8/1973 | Happ | 29/630 RX |

OTHER PUBLICATIONS

"Self-Adhering Metal Evaporation Mask", Keen et al., Western Electric Technical Digest No. 5, Jan. 1967.

Primary Examiner—Francis S. Husar
Assistant Examiner—John E. Roethel
Attorney, Agent, or Firm—R. S. Sciascia; Paul S. Collignon

[57] ABSTRACT

A method for making beam leads for use in the interconnecting of electronic packages to a substrate. Metal foil, such as copper, is etched to form a plurality of beam leads and then a second metal having poor adhesion with said metal foil is deposited onto the metal foil. The second metal is then separated from the metal foil and the metal foil is reuseable as a depository for another deposition of the second metal which is the desired beam leads.

4 Claims, 7 Drawing Figures

METHOD FOR MAKING BEAM LEADS

BACKGROUND OF THE INVENTION

The present invention relates to a method for making beam leads for interconnecting electronic packages to a substrate and more particularly to a method for making thick aluminum (0.001 to 0.002 inch) beam leads.

One heretofore known method of making thick aluminum beam leads consisted of vacuum depositing up to 0.001 inch of aluminum on both sides of an organic plastic film. A window was etched in the aluminum on one side of the film and, simultaneously, a lead pattern was etched in the aluminum on the opposite side of the film. The exposed film was then etched away leaving leads bridging a window. This method has several advantages over other process in that only one aluminum etching step was required and also the aluminum leads were etched while they were still supported by the plastic film.

The use of plastic film in a vacuum-depositing process, however, has various shortcomings. Successful vacuum deposition of aluminum on organic plastic film was very sensitive to cleaning procedures. Also 1 mil thick aluminum was difficult to etch and loss of adhesion was encountered frequently. Because of etching difficulties, thicknesses greater than 1 mil were impossible to achieve. Additionally, the etching process was very sensitive to the deposition rate of the aluminum. Aluminum deposited by a slow rate etched better than aluminum deposited by a faster rate, however, slower deposition rates produced more brittle aluminum than faster rates. Consequently, when the leads were bonded to components, the pull strength of the aluminum leads made by a slow deposition rate was lowered.

SUMMARY OF THE INVENTION

The present invention relates to a method for making beam leads for use in the interconnecting of electronic packages to substrates. A metallic foil pattern is first etched and then a second metal is vacuum deposited onto the metallic foil pattern. The second metal is selected so that there will be poor adhesion between the metallic foil and the second metal, and in a preferred embodiment the foil is copper and the second metal is aluminum. The aluminum is deposited onto the copper at ambient room temperature so as to reduce any tendency of the two metals to adhere. After separating the aluminum deposit from the copper foil pattern, the copper foil pattern can be again used.

It is therefore a general object of the present invention to provide an improved method for making thick aluminum beam leads.

Other objects, advantages, and novel features of the present invention will become apparent from the following detailed description of the invention when considered in conjunction with the accompanying drawing.

DESCRIPTION OF THE PREFERRED EMBODIMENT

Figure 1:
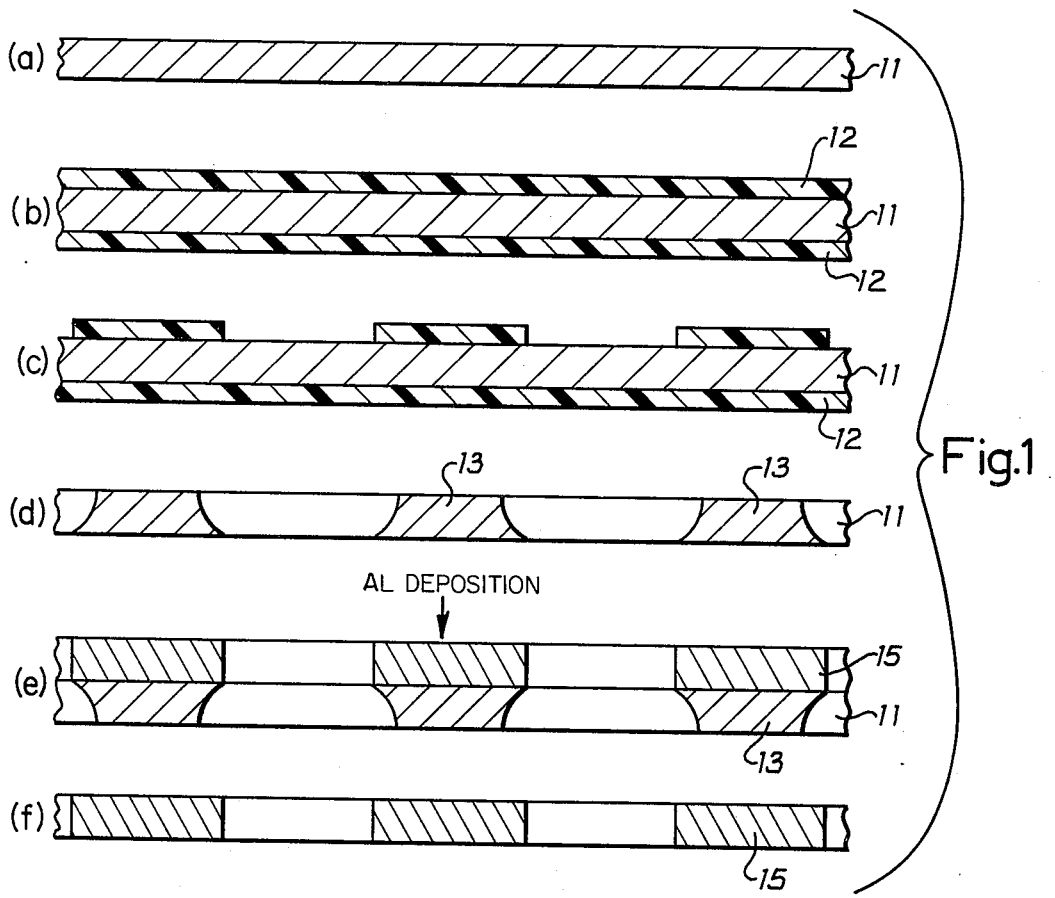
FIGS. 1(a) – 1(f) are views in section showing the various method step of a preferred embodiment of the present invention.
Figure 2:
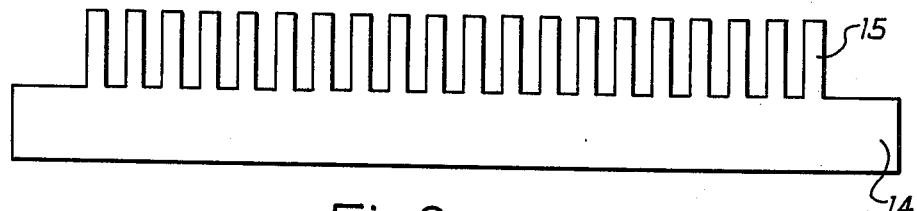
FIG. 2 is a top view of a plurality of beam leads connected to a frame.

Referring now to the drawing, copper foil 11 is imaged with a lead pattern, such as shown in FIG. 2 of the drawing. By way of example, the lead pattern might be imaged onto 0.002 inch copper foil 11 using a DuPont laminated resist. As shown in FIG. 1(b), resist 12 is applied to both sides of foil 12 and FIG. 1(c) shows the lead pattern 13 formed on the top side. The imaged foil is next etched from one side only in ammonium persulfate and because of etching from one side, the cross section of a beam lead 13 is undercut as shown in FIG. 1(d).

The configuration of the etched copper lead frame conforms to the lead pattern shown in FIG. 2 of the drawing and consists of a plurality of lead 13 which are held together by a frame portion 14. The frame portion 14 facilitates handling of the beam leads 13 during manufacture and when the finished aluminum beam leads 15 are attached to a substrate and other components. Frame portion 14, however, is eventually severed from the beam leads 15 and is discarded.

The etched copper having the leads 13 attached to a frame is next placed in a vacuum chamber and aluminum is deposited on one side of the copper foil to the thickness desired. Because of the undercutting, by etching, of the copper, as shown in FIG. 1(d), aluminum is deposited on the wider side of the copper, as shown in FIG. 1(e). This side has the desired final width and because of the undercut, the back and side of the copper lead are masked from the aluminum being deposited. The copper and aluminum leads are then removed from the vacuum chamber and then separated to provide a plurality of aluminum leads as shown in FIG. 1(f) and having the configuration.

The following examples for making aluminum beam leads will facilitate the describing of the present invention.

EXAMPLE I

A 0.002 inch copper foil pattern was made having the configuration shown in FIG. 2 of the drawing. The copper foil pattern was made by etching from one side only and the cross-section of the copper leads is shown in FIG. 1(d). The etched copper leads with frame was placed in a vacuum chamber and pumped down to 5 × $10^{-6}$ torr. Four 500-watt quartz heater lamps were placed directly above the samples and 0.002 inch of aluminum was deposited on the wider side of the etched copper pattern. The foil with aluminum thereon was then removed from the vacuum chamber and the copper was stripped away from the aluminum with 40 percent nitric acid at room temperature. Some alloying of copper and aluminum occurred and the alloy was removed by immersion in 10 percent $Fe(NO_3)_3$, followed by a water rinse, a rinse in 40 percent nitric acid and finally a water rinse.

EXAMPLE II

A 0.002 inch copper foil pattern was made as in EXAMPLE I and placed in a vacuum chamber. The vacuum chamber was not heated, however, and the amount of aluminum source material in a crucible was limited to what was to be deposited. Aluminum was to 0.002 inch at a rate of 30 KA/min., as it was found that this deposition rate gave the strongest bonds. A lowering of the deposition rate caused the leads to be more brittle and fail in the middle of the lead during bond pull testing. By limiting the amount of heat generated during vacuum deposition of aluminum, the copper and aluminum could be readily separated and frequently separate by themselves during removal from the vacuum fixture.

It can thus be seen that the present invention provides an improved method for making aluminum beam leads. No aluminum etching is necessary as definition and uniformity of the leads depends on the results of copper etching, which is much easier to accomplish. Also relatively thick aluminum leads can be made and, regardless of the thickness, the 0.002 inch copper lead carrier can be used.

Although high aluminum deposition rates render aluminum difficult to etch, the process of the present invention does not require the aluminum to be etched and thus high deposition rates for aluminum can be used to produce more flexible aluminum leads having higher tensile strength. As the copper carrier and aluminum leads and frame readily separate, a copper carrier can be used a number of times for receiving a deposit of aluminum thereby reducing the cost of the finished product.

Obviously many modifications and variations of the present invention are possible in the light of the above teachings. It is therefore to be understood, that within the scope of the appended claims, the invention may be practiced otherwise than as specifically described.

I claim:

1. A process for making beam leads for use in the interconnecting of electronic packages to substrates comprising the steps of,
   coating metallic foil with a resist pattern,
   then etching said metallic foil with said resist pattern thereon to form a metallic foil pattern having a plurality of beam leads,
   then depositing a second metal different than said metal of said metallic foil which said second metal has poor adhesion with said metallic foil, and
   then separating said deposited second metal from said metallic foil to provide a plurality of second metal beam leads and whereby said metallic foil pattern is reuseable as a depository for another deposition of said second metal.

2. A process for making beam leads for use in the interconnecting of substrates to electronic packages as set forth in claim 1 wherein said metallic foil is copper and said second metal is aluminum.

3. A process for making beam leads for use in the interconnecting of substrates to electronic packages as set forth in claim 2 wherein said aluminum is deposited at ambient room temperature onto said copper foil.

4. A process for making beam leads for use in interconnecting of substrates to electronic packages as set forth in claim 2 wherein said copper foil is etched from only one side to form a plurality of undercut beam leads each having a top side more narrow in width than a bottom side and wherein said aluminum is deposited onto the bottom sides of said plurality of undercut beam leads.

* * * * *